(12) United States Patent
Zhang

(10) Patent No.: US 7,416,969 B2
(45) Date of Patent: Aug. 26, 2008

(54) VOID FREE SOLDER ARRANGEMENT FOR SCREEN PRINTING SEMICONDUCTOR WAFERS

(76) Inventor: Jian Zhang, 216 Saint Paul St., Unit#301, Brookline, MA (US) 02446

( * ) Notice: Subject to any disclaimer, the term of this patent is extended or adjusted under 35 U.S.C. 154(b) by 0 days.

(21) Appl. No.: 11/067,597

(22) Filed: Feb. 26, 2005

(65) Prior Publication Data

US 2005/0255685 A1    Nov. 17, 2005

Related U.S. Application Data

(60) Continuation-in-part of application No. 10/832,782, filed on Apr. 27, 2004, now Pat. No. 7,008,879, which is a division of application No. 10/186,823, filed on Jul. 1, 2002, now Pat. No. 6,827,789.

(51) Int. Cl.
*H01L 21/44* (2006.01)
(52) U.S. Cl. .................. 438/613; 438/615; 438/706; 438/106; 257/E21.002
(58) Field of Classification Search ................ 438/613, 438/615, 706, 106
See application file for complete search history.

(56) References Cited

U.S. PATENT DOCUMENTS

| | | | | |
|---|---|---|---|---|
| 5,855,465 A | * | 1/1999 | Boitnott et al. | 414/331.18 |
| 6,344,407 B1 | * | 2/2002 | Matsuki et al. | 438/613 |
| 6,596,618 B1 | * | 7/2003 | Narayanan et al. | 438/612 |
| 6,605,524 B1 | * | 8/2003 | Fan et al. | 438/613 |

FOREIGN PATENT DOCUMENTS

JP         10107413 A    *    4/1998

* cited by examiner

*Primary Examiner*—Zandra V. Smith
*Assistant Examiner*—Christy L Novacek
(74) *Attorney, Agent, or Firm*—Don Halgren

(57) ABSTRACT

A process for the production of a void-free semiconductor wafer for the electronics industry, comprising the steps of: applying a coating of a solder paste to a semiconductor wafer through a photoresist film; heating and applying a vacuum to the wafer in a reflow furnace with a controlled formic acid vapor ambient to for a first reflow to remove the flux and form void free solder bumps on the wafer; processing the wafer to remove the photoresist film; heating the wafer in a reflow furnace with a controlled formic acid vapor ambient for a second reflow to remove surface oxides from the wafer and to form the solder into final void free metal solder bumps.

5 Claims, 1 Drawing Sheet

VOID FREE SOLDER ARRANGEMENT FOR SCREEN PRINTING SEMICONDUCTOR WAFERS

This application is a continuation-in part application of U.S. patent application Ser. No. 10/832,782, filed Apr. 27, 2004, now U.S. Pat. No. 7,008,879 which is a divisional application of patent application Ser. No. 10/186,823, filed on Jul. 1, 2002 now U.S. Pat. No. 6,827,789 issued 7 Dec. 2004, each of which are incorporated herein by reference.

BACKGROUND OF THE INVENTION

1. Field of the Invention

The present invention relates to the processing of wafers for the semiconductor industry, and more particularly to processes for the elimination of voids in solder on that wafer.

2. Prior Art

The electronics industry utilizes semiconductor wafers in the production of very large scale integrated circuits (VLSIC) and ultra large scale integrated circuits (ULSIC) for chips and the like. Those semiconductor wafers go through a wide variety of manufacturing standard processes in order to produce a perfect semiconductor product.

One process for such wafers comprises a flux reflow for screen printing solder wherein solder paste is printed onto the surface of a semiconductor wafer through a screen mask. That wafer is then placed into a reflow furnace to begin further processing. The furnace heats the wafer therewithin, to a point above the solder melting temperature. The solder is thus melted with the flux during that reflow process. That melting results in the production of a flux vapor, air, processing gas and other gaseous components which may be trapped inside of the molten solder. Such gaseous components may form voids within the solder "bumps" on the wafer. It is this step that may result in the production of the voids which are generated and left to contaminate the solder on the wafer. That wafer is thus subsequently processed through a photoresist film removal step. The wafer then goes through a conventional flux coating process before a second reflow operation begins. The wafer is then placed into a conventional reflow furnace with controlled nitrogen therein, the sample wafer being heated to above the solder melting temperature again, to produce a final formation of bumps on the wafer, leaving coated flux residues thereon. The wafer sample then in a further step, goes through a conventional chemical and mechanical washing to remove those flux residues. A final step, comprises the wafer sample going through a conventional drying process before a final inspection. The wafer with its circuit thereon, and the solder bumps thereon, may contain a lot of voids in that solder, which voids are undesirable for optimum wafer utilization.

Such voids within the solder bumps reduces production yield and ultimately minimizes device reliability. Other disadvantages of these prior art wafer treatments is the high cost of flux and deflux chemicals. In this traditional source of production for wafers in the semiconductor industry, the equipment to produce such wafers has a large footprint which leads to a high cost of capital equipment and a unnecessarily high cost clean room. Further disadvantages include environmental hazards created by the chemical treatment required herein.

It is an object of the present invention to overcome the disadvantages of the prior art.

It is a further object of the present invention to provide a wafer processing operation which simplifies the steps required by reducing the number of those steps necessary to produce a satisfactory semiconductor wafer.

It is a further object of the present invention to provide a wafer processing operation which is more environmentally friendly than the prior art.

It is a further object of the present invention to provide a wafer processing operation which is more economical to run that the prior art, both in size of the apparatus for completing the steps and for minimizing the cost of materials.

BRIEF SUMMARY OF THE INVENTION

The present invention relates to a method of processing semiconductor wafers for the electronics industry. The processing takes place through an arrangement of sequential, isolated treatment locations or chambers for the processing of those semiconductor wafers. The mechanism for processing a series of such wafers in one preferred embodiment for example, comprise a frame support for a wafer process table and a wafer and feed and removal robot arrangement thereadjacent. The wafer process table comprises a plurality of housing or chamber covers, each positioned on a stationary upper plate as part of a treatment module for each position in the process of treatment of the semiconductor wafers.

The wafer process table includes a stationary lower housing platen surrounding a central transmission drive unit which rotatively indexes an indexable rotary index plate between a plurality of treatment modules through the sequential steps in the treatment process at the wafer process table. Each step in the process is accomplished by the preferred embodiment of the mechanism, as the intermediately disposed rotary index plate rotatably indexes through a series of positions, which positions register with the upper plate and the housing covers associated therewith, and the stationary lower housing platen with its respective treatment modules.

The first step in the inventive process takes place at a first station or module where a robotic arm loads a wafer in a pre-alignment station wherein that wafer is enclosed within the module and that module is preferably purged by a charge of nitrogen and/or its atmosphere within that module may be subject to a vacuum.

The intermediate indexing plate supporting the wafer thereon, is rotated to its next position on the table, where the screen printing process is further undertaken when the module cover is closed about that semiconductor wafer. The module at this location is heated and/or has a vacuum applied thereto so as to drive out the flux in the paste thereon by heating that wafer to a temperature below the melting temperature of solder, which temperature is less than about 183 degrees centigrade for eutectic, and less than about 227 degrees centigrade for lead free solder, and for less than about 320 degrees centigrade for high lead solder.

Next, the indexing table is then rotated, to carry the semiconductor wafer to its next position on the process table wherein the wafer is subject to a further lower temperature heat treatment and a vacuum so as to drive out the flux which is in the solder paste, thus removing such flux without melting that solder.

Then, the indexing plate containing the semiconductor wafer is thus sequentially advanced to its next operating module wherein a vacuum is applied to that chamber (at less than 10 torr) and heat is subsequently applied to that semiconductor wafer, which temperature is above the melting temperature of the particular solder on that wafer. The vacuum applied to the wafer within that treatment module stays on during the melting process, which takes between about 15 to 60 seconds.

The vacuum applied to the solder, which solder is now in its molten state in this particular portion of the treatment, has no air trapped therewithin. The molten solder is now in a "void-free" state.

The indexing plate carrying the semiconductor wafer is rotatively advanced to its next treatment station wherein the wafer is heated so as to cause the reflow of the solder at a controlled temperature so it will adhere to the metal under the "void-free" solder bump.

The indexing plate is then advanced to a next treatment module on the process table, wherein that semiconductor wafer is cooled and the solder thereon is hardened into a void free solder ball.

After sufficient cooling has occurred, the indexing plate is advanced to its final module location wherein the fully processed semiconductor wafer is unloaded by the robotic arm and a fresh semiconductor wafer with its paste already applied thereon, is loaded onto the platen at that particular spot on the indexing table for its treatment through the sequential process in this void free solder reflow screen printing operation.

BRIEF DESCRIPTION OF THE DRAWINGS

The objects and advantages of the present invention will become more apparent when viewed in conjunction with the following drawing in which.

DETAILED DESCRIPTION OF THE PREFERRED EMBODIMENTS

Figure 1:
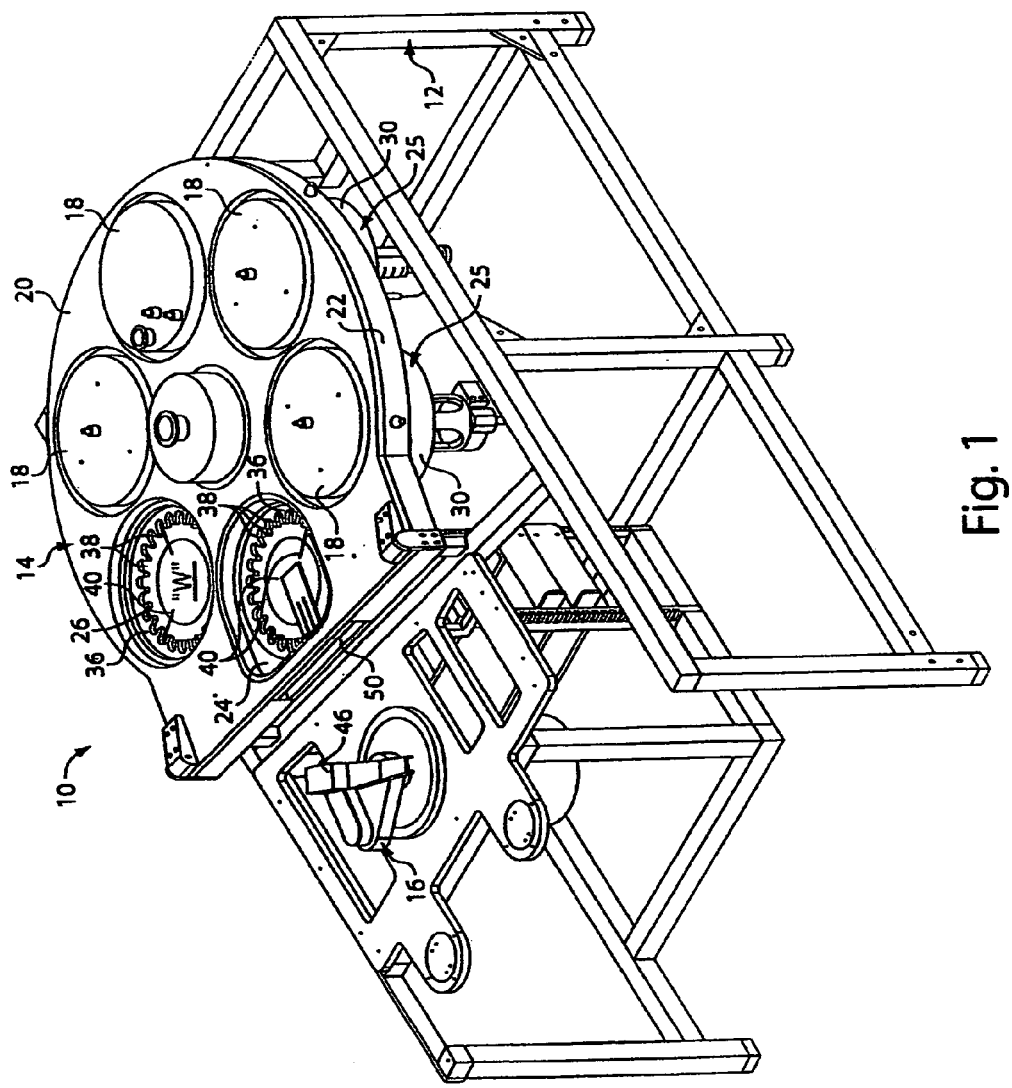
FIG. 1 is a perspective view of a serial thermal processing apparatus which may be utilized in carrying out the steps of the present invention.

Referring now to discuss the invention in detail, the typical steps required in the prior art production of a semiconductor wafer are recited hereinbelow.

Such prior art steps include:
1. printing solder paste on a semiconductor wafer;
2. placing the wafer in a reflow furnace and heating the wafer to a solder melting temperature to melt the solder with the flux during the reflow, resulting in the generation of gaseous byproducts, often within the molten solder, thus creating voids in that solder;
3. working the wafer through the conventional photoresist (PR) film removal process;
4. working the wafer through the conventional flux coating process before a $2^{nd}$ flux reflow in a conventional furnace;
5. placing the wafer in that conventional furnace for $2^{nd}$ reflow with a nitrogen ambient, heating the wafer to above solder melting temperature to generate the final formation of solder "bumps" with its coated flux residues;
6. working the wafer through a conventional chemical and mechanical washing to remove those flux residues; and
7. working the wafer through a conventional drying process, leaving however, a collection of "voids" within the solder bumps.

The steps involved in the present invention no-flux process comprise:
1. printing solder paste on a semiconductor wafer through a photoresist (PR) film or pattern mask using screen printing;
2. placing the wafer in a reflow furnace with a controlled ambient including applying the proper heating and/or vacuum for the $1^{st}$ reflow to completely remove the flux and form "void-free" solder "bumps";
3. processing the wafer through a conventional photoresist (PR) film removal step; and
4. placing the wafer into a reflow furnace again with a controlled formic acid vapor ambient, for a $2^{nd}$ reflow, and to remove surface oxides and to form the final solder ":bumps" without any "voids" within those solder "bumps".

The present invention may also be described as a method of processing semiconductor wafers for the electronics industry wherein the processing takes place through an arrangement of sequential, isolated treatment locations or chambers for the processing of those semiconductor wafers, as is represented for example, in FIG. 3, and as identified in the references incorporated herein. A processing mechanism 10 for processing a series of such wafers 12 in one preferred embodiment comprises a frame support 14 for a wafer process table 16 and a wafer and feed and removal robot arrangement 18 thereadjacent. The wafer process table 16 comprises a plurality of housing or chamber covers 20, each positioned on a stationary upper plate 22 as part of a treatment module for each position in the process of treatment of the semiconductor wafers 12.

The wafer process table includes a stationary lower housing platen 24 surrounding a central transmission drive unit 26 which rotatively indexes an indexable rotary index plate 28 between a plurality of treatment modules A-F through the sequential steps in the treatment process at the wafer process table 16. Each step in the process is accomplished by the preferred embodiment of the mechanism, as the intermediately disposed rotary index plate 28 rotatably indexes through a series of positions/modules A-F, which positions A-F register with the upper plate and the housing covers 20 associated therewith, and the stationary lower housing platen 24 defining the respective treatment modules A-F.

The first step in the inventive process takes place at a first station or module A where a robotic arm 18 loads a wafer 12 in a pre-alignment station wherein that wafer 12 is enclosed within the module A and that module A, shown without a cover 20 for clarity, is preferably purged by a charge of nitrogen and/or its atmosphere within that module A may be subject to a vacuum.

The intermediate indexing plate 28 supporting the wafer 12 thereon, is rotated to its next position B on the table 16, where the screen printing process is further undertaken when the module cover 20 is closed about that semiconductor wafer 12. The module B at this location is heated and/or has a vacuum applied thereto so as to drive out the flux in the paste thereon by heating that wafer 12 to a temperature below the melting temperature of solder, which temperature is less than about 180 degrees centigrade for eutectic, and less than about 220 degrees centigrade for lead free solder, and for less than about 320 degrees centigrade for high lead solder.

Next, the indexing table 28 is then rotated, to carry the semiconductor wafer 12 to its next position C on the process table 16 wherein the wafer 12 is subject to a further lower temperature heat treatment and a vacuum so as to drive out the flux which is in the solder paste, thus removing such flux without melting that solder o that wafer 12.

Then, the indexing plate 28 containing the semiconductor wafer 12 is thus sequentially advanced to its next operating module D wherein a vacuum is applied to that chamber (at less than 10 torr) and heat is subsequently applied to that semiconductor wafer, which temperature is above the melting temperature of the particular solder on that wafer. The vacuum applied to the wafer within that treatment module D stays on during the melting process, which takes between about 15 to 60 seconds. The vacuum applied to the solder, which solder is now in its molten state in this particular portion of the treatment, has no air trapped therewithin. The molten solder on that wafer 12 is now in a "void-free" state.

The indexing plate 28 carrying the semiconductor wafer chip 12 is rotatively advanced to its next treatment station E wherein the wafer 12 is heated so as to cause the reflow of the solder at a controlled temperature so it will adhere to the metal under the "void-free" solder bump.

The indexing plate 28 is then advanced to a next treatment module F on the process table 16, wherein that semiconductor wafer 12 is cooled and the solder thereon is hardened into a "void free" solder ball or "bump".

After sufficient cooling has occurred, the indexing plate 28 is advanced back to its initial/final module location A wherein the fully processed semiconductor wafer 12 is unloaded by the robotic arm 18 and a fresh semiconductor wafer 12' with its paste already applied thereon, is loaded onto the platen at that particular spot A on the indexing table for its treatment through the sequential process in this "void free" solder reflow screen printing operation.

I claim:

1. A process for the production of a void-free semiconductor wafer for the electronics industry through a rotatably indexed sequence of isolated, pressure controlled chambers in a wafer processing apparatus cycling between a vacuum and a controlled ambient pressure, comprising the steps of:
   applying a solder paste through a photoresist film mask to a semiconductor wafer which is to be processed by said apparatus
   placing said wafer in a chamber and purging said chamber with nitrogen and applying a vacuum to said chamber;
   heating said wafer in a reflow furnace to a temperature below the melting point of solder under a vacuum in a successive chamber of said apparatus;
   heating said wafer in a reflow furnace with a controlled formic acid vapor ambient for a second reflow to remove surface oxides from said wafer and to form said solder into final metal solder bumps in a final chamber; and
   cooling said wafer in a further chamber to harden said solder.

2. The process of claim 1, wherein said first reflow step includes;
   applying a vacuum during said heating of said wafer.

3. A process for the production of a void-free semiconductor wafer for the electronics industry, comprising the steps of:
   applying a paste through a photoresist film mask onto a semiconductor wafer to be subsequently processed in a sequence of circumferentially adjacent chambers which chambers are pressure cycled between a controlled ambient pressure and a vacuum therewithin;
   rotating said wafer to a chamber and heating said wafer to a temperature below the melting point of solder and applying a vacuum to said wafer in a reflow furnace with a controlled formic acid vapor ambient for a first reflow to remove the flux and form void free solder bumps on said wafer;
   processing said wafer in a further chamber by again heating said wafer at a temperature below the melting point of solder and under a vacuum;
   further processing said wafer at a subsequent chamber by heating said wafer to a temperature above the melting point of solder and maintaining a vacuum during the solder melting process;
   heating said wafer again to effect solder reflow in a further chamber reflow furnace with a controlled formic acid vapor ambient for a second reflow to remove surface oxides from said wafer and to form said solder into final metal solder bumps; and
   advancing said wafer to a cooling chamber to harden said solder into a void free state.

4. A process for the production of a void-free semiconductor wafer for the electronics industry through a plurality of annularly disposed, independently atmospherically controlled processing stations in a semiconductor processing apparatus, comprising the steps of:
   applying a photoresist film mask through a mask to a semiconductor wafer and loaded into a first chamber to be further processed at a controlled ambient pressure or vacuum;
   applying a vacuum to said wafer in a first reflow furnace with a controlled formic acid vapor ambient for a first reflow to remove the flux and form void free solder bumps on said wafer in a further chamber;
   processing said wafer in a further chamber to remove said photoresist film;
   heating said wafer in a reflow furnace above the melting point of solder with a controlled formic acid vapor ambient for a second reflow to remove surface oxides from said wafer and to form said solder into final metal solder bumps; and
   chilling said wafer in a further chamber.

5. The process as recited in claim 4, wherein the first reflow step includes:
   heating said wafer to a temperature just below the melting temperature of said solder on said wafer.

* * * * *